US010186392B2

(12) United States Patent
Graber et al.

(10) Patent No.: US 10,186,392 B2
(45) Date of Patent: Jan. 22, 2019

(54) ULTRAFAST ELECTROMECHANICAL DISCONNECT SWITCH

(71) Applicant: The Florida State University Research Foundation, Inc., Tallahassee, FL (US)

(72) Inventors: Lukas Graber, Tallahassee, FL (US); Christopher Widener, Tallahassee, FL (US); Samantha Smith, Tallahassee, FL (US); Michael Steurer, Crawfordville, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 360 days.

(21) Appl. No.: 15/214,015

(22) Filed: Jul. 19, 2016

(65) Prior Publication Data

US 2016/0329182 A1 Nov. 10, 2016

Related U.S. Application Data

(63) Continuation of application No. PCT/US2015/012583, filed on Jan. 23, 2015.

(Continued)

(51) Int. Cl.
*H01L 41/08* (2006.01)
*H01H 57/00* (2006.01)

(Continued)

(52) U.S. Cl.
CPC ............ *H01H 57/00* (2013.01); *H01H 33/28* (2013.01); *H01H 55/00* (2013.01); *H01H 33/14* (2013.01); *H01H 33/64* (2013.01); *H01H 33/666* (2013.01)

(58) Field of Classification Search
CPC ........ H01H 57/00; H01H 33/14; H01H 33/28; H01H 33/64; H01H 33/666; H01H 55/00
See application file for complete search history.

(56) References Cited

U.S. PATENT DOCUMENTS 2,743,338 A 4/1956 Graybill
3,177,316 A 4/1965 Mertler (Continued)

FOREIGN PATENT DOCUMENTS

EP 1471558 A2 * 10/2004 ............. H01H 57/00

OTHER PUBLICATIONS

International Search Report, Written Opinion and Search History dated May 4, 2015 for corresponding International Patent Application No. PCT/US2015/012583 with international filing date of Jan. 23, 2015.

(Continued)

*Primary Examiner* — J. San Martin
(74) *Attorney, Agent, or Firm* — Molly L. Sauter; Nilay J. Choksi; Smith & Hopen, P.A.

(57) ABSTRACT

An ultrafast electrical (e.g., transfer, disconnect, etc.) switch that is simple, compact, does not require high energy to operate, ultralow loss, clean, and capable of being automatically reset. The invention includes a fast electromechanical switch having a drive mechanism integrated into the switching chamber. The integration of the drive mechanism into the switching chamber provides faster contact travel and therefore a faster switching operation. Additionally, the switching chamber is a self-contained environment that may consist of a high-pressure gas or a vacuum. The invention further includes an ultrafast disconnect switch. The invention generally is an integrated piezoelectric-actuator-based mechanical switching mechanism. The mechanism has a central piezoelectric actuator that extends to pull contacts (Continued)

inwards in order to obtain two disconnects within a millisecond or less. Surrounding the piezoelectric actuator is a polymer insulating shell and beyond the shell is the metallic conductor.

20 Claims, 4 Drawing Sheets

Related U.S. Application Data

(60) Provisional application No. 62/033,454, filed on Aug. 5, 2014, provisional application No. 61/930,755, filed on Jan. 23, 2014.

(51) Int. Cl.

| | |
|---|---|
| ***H01H 33/28*** | (2006.01) |
| ***H01H 55/00*** | (2006.01) |
| *H01H 33/14* | (2006.01) |
| *H01H 33/64* | (2006.01) |
| *H01H 33/666* | (2006.01) |

(56) References Cited

U.S. PATENT DOCUMENTS

| | | | | |
|---|---|---|---|---|
| 3,708,637 | A | 1/1973 | Krueger et al. | |
| 4,120,479 | A | 10/1978 | Thompson et al. | |
| 5,315,204 | A * | 5/1994 | Park | H01H 57/00 310/339 |
| 6,498,315 | B1 | 12/2002 | Betz et al. | |
| 9,064,663 | B2 * | 6/2015 | Taka | H01H 57/00 |
| 9,570,783 | B1 * | 2/2017 | Lee | H01P 1/15 |
| 2002/0191893 | A1 | 12/2002 | Bona et al. | |
| 2004/0155736 | A1 * | 8/2004 | Song | H01H 57/00 335/78 |
| 2004/0201330 | A1 * | 10/2004 | Fong | G02B 26/004 310/365 |
| 2006/0181375 | A1 * | 8/2006 | Nakatani | H01H 57/00 335/78 |
| 2009/0294263 | A1 * | 12/2009 | De Vries | H03K 17/964 200/181 |
| 2011/0024274 | A1 | 2/2011 | Yoshihara et al. | |
| 2013/0140156 | A1 * | 6/2013 | Fujii | H01L 41/0838 200/181 |
| 2013/0161164 | A1 * | 6/2013 | Taka | H01H 57/00 200/181 |
| 2014/0225821 | A1 * | 8/2014 | Kim | H04M 1/236 345/156 |
| 2015/0378514 | A1 * | 12/2015 | Keski-Jaskari | H03K 17/964 345/178 |

OTHER PUBLICATIONS

International Preliminary Report on Patentability dated Aug. 4, 2016 for corresponding International Patent Application No. PCT/US2015/012583 with international filing date of Jan. 23, 2015.

* cited by examiner

ULTRAFAST ELECTROMECHANICAL DISCONNECT SWITCH

CROSS-REFERENCE TO RELATED APPLICATIONS

This nonprovisional application is a continuation of and claims priority to International Patent Application No. PCT/US2015/012583, entitled Ultrafast Electromechanical Disconnect Switch", filed Jan. 23, 2015 by the same inventors, which claims priority to U.S. Provisional Application No. 61/930,755, entitled "Fast Electrochemical Disconnect Switching Chamber with Integrated Drive Mechanism", filed Jan. 23, 2014 by the same inventors, and to U.S. Provisional Application No. 62/033,454, entitled "Ultrafast Disconnect Switch", filed Aug. 5, 2014 by the same inventors, all of which are incorporated herein by reference in their entireties.

FEDERALLY SPONSORED RESEARCH OR DEVELOPMENT

This invention was made with Government support under Grant No. EEC0812121 awarded by National Science Foundation. The government has certain rights in the invention.

BACKGROUND OF THE INVENTION

1. Field of the Invention

This invention relates, generally, to electric power systems. More specifically, it relates to mechanical switches (e.g., transfer or disconnect switches) in a hybrid circuit breaker.

2. Brief Description of the Prior Art

A transfer switch is an electrical component capable of transferring loads between multiple sources. In the past, fast transfer switches have been developed from Thomson coils, power electronics, propellant-based systems, or coupled electromechanical and hydraulic systems. However, each of the foregoing is flawed. Thomson coils require high current pulses, power electronics switches have significant conduction losses, propellant based systems cannot be automatically reset, and coupled electromechanical and hydraulic systems can be complex and slow.

For conventional disconnect switch applications where non-current-carrying electrical conductors are physically moved to achieve separation from each other, and thus creating electrical isolation, coupled mechanical systems are used to separate the contacts enough so that the voltage withstand of the contact gap is sufficient for the application. This contact separation is conventionally achieved by an indirect application of force through a series of levers, a direct application of force with the contacts enclosed in a vacuum or pressurized gas medium (called the switching chamber), or a combination of the two methods. One of the drawbacks of these methods is the fact that they are too slow and cumbersome in achieving the necessary voltage withstand capability for ultrafast medium voltage (1 kV-69 kV) switching applications. Such types of disconnect switches are not suitable for the hybrid power electronics and mechanical disconnect switch that are currently being developed around the world.

To handle high magnitude fault currents in a system, large, slow circuit breakers are typically used. However, the need to deal with these fault currents can be replaced with a need to operate as fast as possible to provide sufficient flexibility and re-configurability of the system.

Accordingly, what is needed is an ultrafast disconnect/transfer switch that is simple, compact, does not need high energy to operate (relative to the Thomson coil designs), ultralow loss (relative to the power electronic solution), clean, and capable of being automatically reset (as compared to the propellant based systems), thus providing more effective control over use and control of power. However, in view of the art considered as a whole at the time the present invention was made, it was not obvious to those of ordinary skill in the field of this invention how the shortcomings of the prior art could be overcome.

While certain aspects of conventional technologies have been discussed to facilitate disclosure of the invention. Applicants in no way disclaim these technical aspects, and it is contemplated that the claimed invention may encompass one or more of the conventional technical aspects discussed herein.

The present invention may address one or more of the problems and deficiencies of the prior art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

BRIEF SUMMARY OF THE INVENTION

The long-standing but heretofore unfulfilled need for more effective ultrafast transfer switches and disconnect switches is now met by a new, useful, and nonobvious invention.

In an embodiment, the current invention is an electrical transfer or disconnect switch, for example applied to a high current, low voltage system. The switch includes two electrical feedthroughs disposed through an insulating medium (e.g., ceramics) and respectively connected to two non-movable electrical contacts. A third non-movable electrical contact is coupled to the insulating medium and positioned between the first two non-movable contacts, such that a static gap is formed between the first and third non-movable contacts and a static gap is formed between the second and third non-movable contacts. An actuator (e.g., piezoelectric actuator) is aligned with each static gap but at a spaced distance away from the non-movable contacts. The switching mechanism further includes movable contacts that are coupled directly or indirectly to the actuators and aligned with the static gaps, such that variable gaps are formed between the movable contacts and the non-movable contacts. When the actuators are prompted, the movable contacts reduce the variable gaps until each is contacting their respective non-movable contacts simultaneously to complete the electrical series between the non-movable contacts.

The switching mechanism may further include a switching chamber (e.g., containing vacuum or pressurized gas) that would enclose or house at least the insulating medium, the non-movable contacts, and the movable contacts. In a further embodiment, the electrical feedthroughs may be disposed through a flange into the interior of the switching chamber where they contact or connect to the non-movable contacts. The electrical feedthroughs each contain conductors that connect to systems that are separated by a disconnect controlled by the switching mechanism.

The switching mechanism may further include one or more precision adjustment screws coupled to the non-movable contacts for adjusting the non-movable contacts.

The switching mechanism may further include one or more control signal wires that pass through a control wire feedthrough and are coupled to the actuators for controlling the actuators.

The switching mechanism may further include insulators positioned between the actuators and movable contacts to electrically insulate the actuators and movable contacts from each other.

In a separate embodiment, the current invention is an electrical transfer or disconnect switch, for example applied to a low current, high voltage system. The switch includes two non-movable electrical contacts coupled to an insulating medium. A third non-movable contact is coupled to the insulating medium as well and positioned between the first two non-movable contacts to provide conduction between the first two non-movable contacts when they are in series. A static gap is formed between one of the first two non-movable contacts and the third non-movable contact, and another static gap is formed between the other of the first two non-movable contacts and the third non-movable contact. The switch further includes an actuator (e.g., piezoelectric actuator) having two mounting plates, where each mounting plate is aligned with each static gap but positioned at a spaced distance away from the non-movable gaps and from the static gap. Movable contacts are directly or indirectly coupled to the mounting plates and are aligned with the static gaps, such that the movable contacts physically contact the ends of the non-movable contacts to complete the electrical series between the non-movable contacts. When the actuators are prompted, the actuators pull inwards, causing the movable contacts to shift or reposition in a direction away from the non-movable contacts, such that variable gaps are formed between each movable contact and the corresponding non-movable contacts and the series is broken/disconnected.

The switching mechanism may further include a switching chamber (e.g., containing vacuum or pressurized gas) that would enclose or house at least the insulating medium, the non-movable contacts, and the actuator.

The switching mechanism may further include one or more precision adjustment screws coupled to the non-movable contacts for adjusting the non-movable contacts.

The insulation medium may be disposed between the actuator/mounting plates and movable contacts to electrically insulate the actuator/mounting plates and movable contacts from each other.

The static gaps may be positioned on opposite sides from each other on the insulation medium, such that the actuator forms an elliptical shell configuration about the piezoelectric stack. In this case, the mounting plates would face in opposite directions from each other. In a further embodiment, the longitudinal ends of the elliptical shell can be flexibly held in place within slots formed in the insulation medium.

In a separate embodiment, the current invention is an electrical switch. The switch generally includes two (2) non-movable electrical contacts coupled to an insulating medium, where a static gap is formed between the two non-movable contacts. An actuator (e.g., piezoelectric actuator or magnetostrictive actuator) is aligned with the static gap but positioned at a spaced distance away from the non-movable contacts. A movable contact is coupled directly or indirectly to the actuator and aligned with the static gap, such that the movable contacts physically contact the ends of the non-movable contacts to complete the electrical series between the non-movable contacts. When the actuators are prompted, the actuators pull inwards, causing the movable contacts to shift or reposition in a direction away from the non-movable contacts, such that a variable gap is formed between the movable contact and the non-movable contacts and the series is broken/disconnected.

The switching mechanism may further include a switching chamber (e.g., containing vacuum or pressurized gas) that would enclose or house at least the insulating medium, the non-movable contacts, the movable contact, and the actuator.

The insulation medium may be disposed between the actuator and movable contact to electrically insulate the actuator and movable contact from each other.

An object of the present invention is to use a vacuum or pressurized gas chamber with internal actuator-driven contacts for an electrical switch that can provide ultrafast voltage withstand capability. It fills a need for use in hybrid breaker applications in current-limited electrical distribution systems and other possible applications.

These and other important objects, advantages, and features of the invention will become clear as this disclosure proceeds.

The invention accordingly comprises the features of construction, combination of elements, and arrangement of parts that will be exemplified in the disclosure set forth hereinafter and the scope of the invention will be indicated in the claims.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

Figure 1:
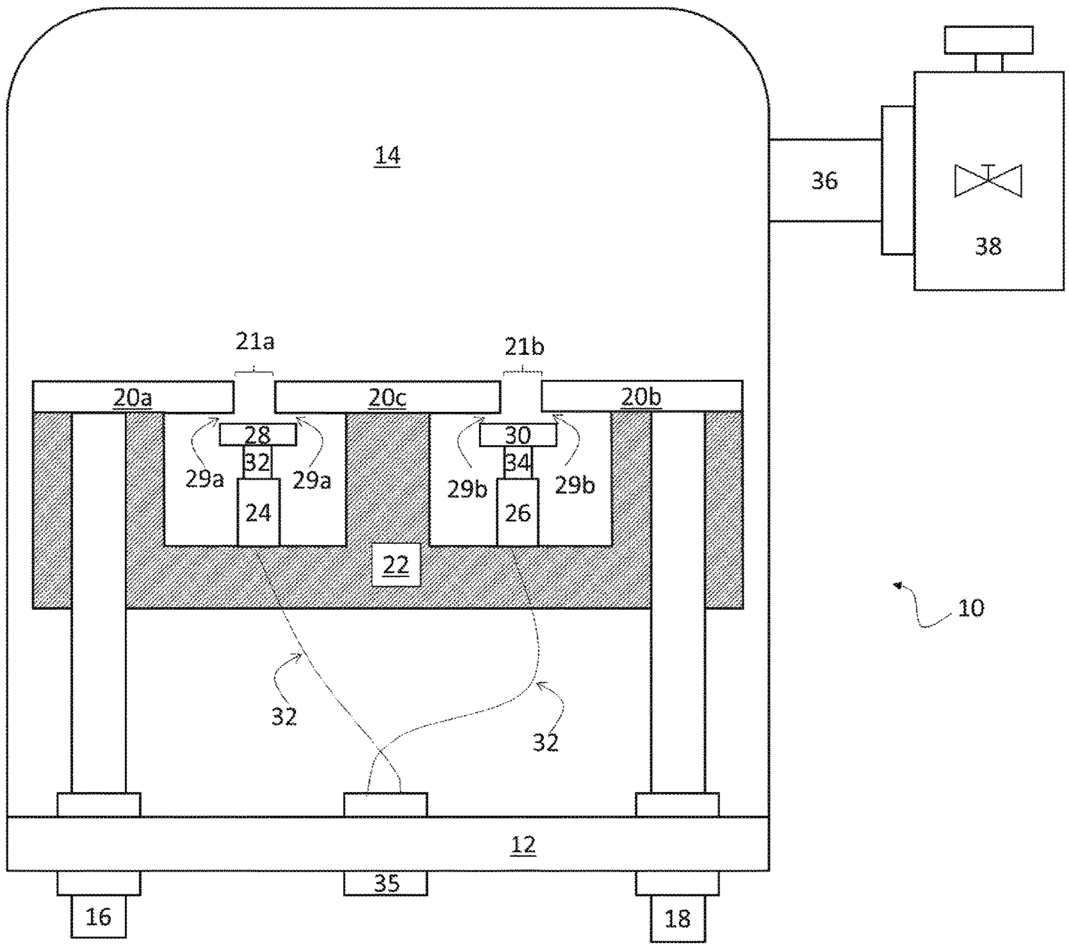
FIG. 1 depicts an embodiment of the present invention utilizing two non-amplified piezoelectric actuators.

In the following detailed description of the preferred embodiments, reference is made to the accompanying drawings, which form a part thereof, and within which are shown by way of illustration specific embodiments by which the invention may be practiced. It is to be understood that other embodiments may be utilized and structural changes may be made without departing from the scope of the invention.

In an embodiment, the current invention is an ultrafast electromechanical switch having a drive mechanism integrated into a switching chamber. The present invention makes use of the ultrafast response times of electromechanical actuators (e.g., piezoelectric or magnetostrictive actuator) and integrates them inside a switching chamber so that their force can be applied directly to separate the contacts, creating a compact ultrafast disconnect switch. It is contemplated herein that the drive mechanism can be a piezoelectric actuator, magnetostrictive actuator, or any other drive mechanism known by one of ordinary skill in the art. The integration of the drive mechanism in the present invention allows for significantly faster contract travel and therefore faster switching operation than would be otherwise capable. The switching chamber is designed to enclose the switching mechanism within a self-contained environment, which includes, but is not limited to, a high-pressure gas or vacuum environment. Other suitable environments are contemplated herein as well.

In certain embodiments, the present invention utilizes a vacuum to enclose the switching chamber. The vacuum provides a benign environment resulting in zero oxidation and allows use of reactive materials, including but not limited to, aluminum. The vacuum also decreases contact wear due to the lack of electric arcs. Such a design would greatly improve the working life of a switching chamber. Other suitable insulation mediums, such as liquids for example, are contemplated herein. Choice of insulation medium may depend on voltage and current levels desired, among other factors.

In an embodiment, the invention can be implemented in a manner that significantly improves its performance, particularly with regards to voltage rating and current carrying capability (i.e., power rating).

In an embodiment that may become more apparent in Example 1 infra, the current invention includes a piezoelectric stack, such that when an electric field is applied internally, the stack expands or lengthens linearly to separate electrical contacts from each other or to cause electrical contacts to contact each other. The very small distance that electrical contacts must move/shift may limit the voltage range but simultaneously allows for very high forces, which is suitable for high current levels.

In another embodiment that may become more apparent in Example 2 infra, the piezoelectric stack is configured in a shell that is relatively malleable and can be about as thick as the shell itself. The stack is present in the long axis of the shell. When the stack expands due to an internally applied electric field, the circumference of the shell would remain similar, though the short sides of the shell would contract to pull the contacts inward and disconnect the series. Because the shell is elliptical or ovular in nature, the shell can contract as much as the stack expands. Because of this, some of the higher forces may be lost, but because of the more compact separation, the device can be designed for higher voltage, lower current applications.

Any combination of the following examples (or elements thereof) is also contemplated herein by the current invention.

EXAMPLE 1

In an embodiment, as shown in FIG. 1, the current invention is a switching mechanism, generally denoted by the reference numeral 10, that includes an enclosed switching chamber created with the use of flange (12) and vessel (14). Electrical feedthroughs (16, 18) pass through flange (12) into the switching chamber. On the outside of the switching chamber, the conductors (not shown in this figure) that pass through feedthroughs (16, 18) are used to connect to the two electrical poles of the system that will be separated by the disconnect. Inside the switching chamber, feedthroughs (16, 18) connect to non-movable electrical contacts (20*a*, 20*b*), once feedthroughs (16, 18) have passed through the block of insulating material (22). Insulating material (22) serves to electrically insulate switching mechanism (10) from the surrounding walls of vessel (14) and flange (12). Non-movable contact (20*c*) is coupled to insulating material (22) and is positioned between non-movable contacts (20*a*, 20*b*), such that static gap (21*a*) exists between non-movable contacts (20*a*, 20*c*) and static gap (21*b*) exists between non-movable contacts (20*b*, 20*c*).

Switching mechanism (10) further includes piezoelectric actuators (24, 26) directly or indirectly coupled to two movable contacts (28, 30). Piezoelectric actuators (24, 26) and movable contacts (28, 30) can be electrically insulated from each other with insulators (32, 34) disposed therebetween, as seen in FIG. 1. Actuators (24, 26) each have a contracted position and an extended position. FIG. 1 shows actuators (24, 26) being inactivated/unpowered and disposed in at least a partially contracted position, where movable contacts (28, 30) do not physically contact non-movable contacts (20*a*, 20*b*, 20*c*).

When actuator (24) is at its full extension (i.e., when actuator (24) is powered), movable contact (28) is physically pressed up against non-movable contacts (20*a*, 20*c*). When actuator (26) is at its full extension (i.e., when actuator (26) is powered), movable contact (30) is physically pressed up against non-movable contacts (20*b*, 20*c*) (not shown in this figure but shown in FIG. 2). This creates a completed electrical pathway between the electrodes. When complete, the electrical pathway would flow as follows: electrical feedthrough (16), non-movable contact (20*a*), movable contact (28), non-movable contact (20*c*), movable contact (30), non-movable contact (20*b*), and electrical feedthrough (18).

When actuators (24, 26) are at their full or at least partial contraction (i.e., when actuators (24, 26) inactivated, unpowered, or otherwise unprompted), variable gap (29*a*) exists between non-movable contacts (20*a*, 20*c*) and movable contact (28), and variable gap (29*b*) exists between non-movable contacts (20*b*, 20*c*) and movable contact (30). The sum of variable gaps (29*a*, 29*b*) may be used to determine the voltage withstand capability (e.g., up to about 2 kV) of switching mechanism (10) (e.g., disconnect switch) when open (actuators in full contraction).

Piezoelectric actuators (24, 26) can be controlled with control signal wires (32) that pass through the control wire feed-through (35).

Vessel (14) can be evacuated or pressurized through side port (36) with isolation valve (38).

With this configuration, all four (4) contact points (i.e., movable contact (28) and non-movable contact (20*a*), movable contact (28) and non-movable contact (20*c*), movable contact (30) and non-movable contact (20*b*), and movable contact (30) and non-movable contact (20*c*)) are electrically in series and operate at the same time, thus providing four (4) times the standoff voltage while in open position.

With the ultrafast response times of the integrated piezoelectric actuators (24, 26) combined with creation of the multiple gaps (29*a*, 29*b*) inside a sealed switching container (flange (12), vessel (14)) containing vacuum or pressurized gas, switching mechanism (10) provides the switching time and voltage withstand capability to fill a void in options that has existed for applications until now. In particular, switching mechanism (10) can be extremely useful in the design of hybrid circuit breaker applications in medium voltage AC and DC electrical distribution systems.

EXAMPLE 2

Figure 2:
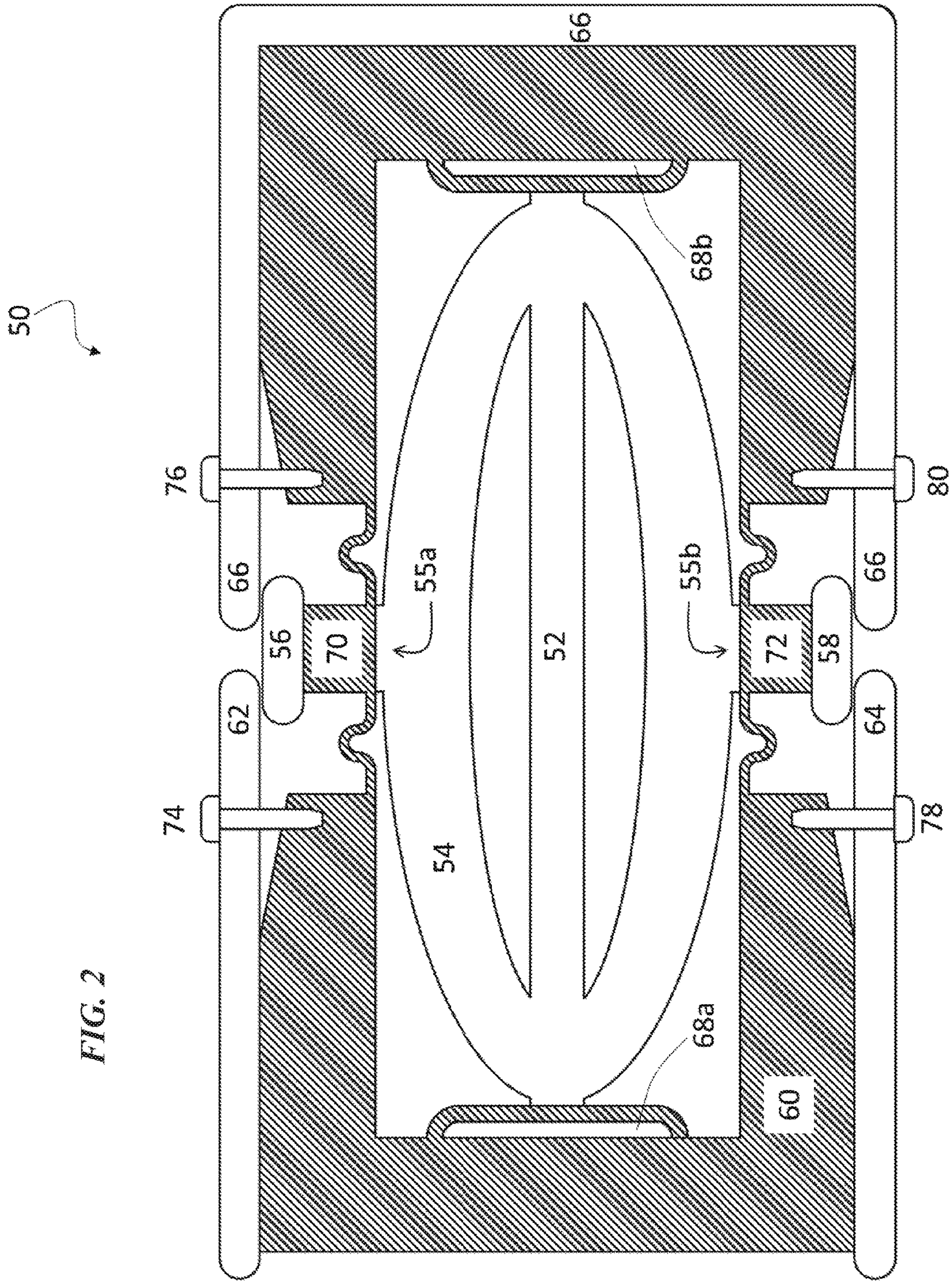
FIG. 2 is a schematic depicting an embodiment of the current invention using a single amplified piezoelectric actuator.
Figure 3:
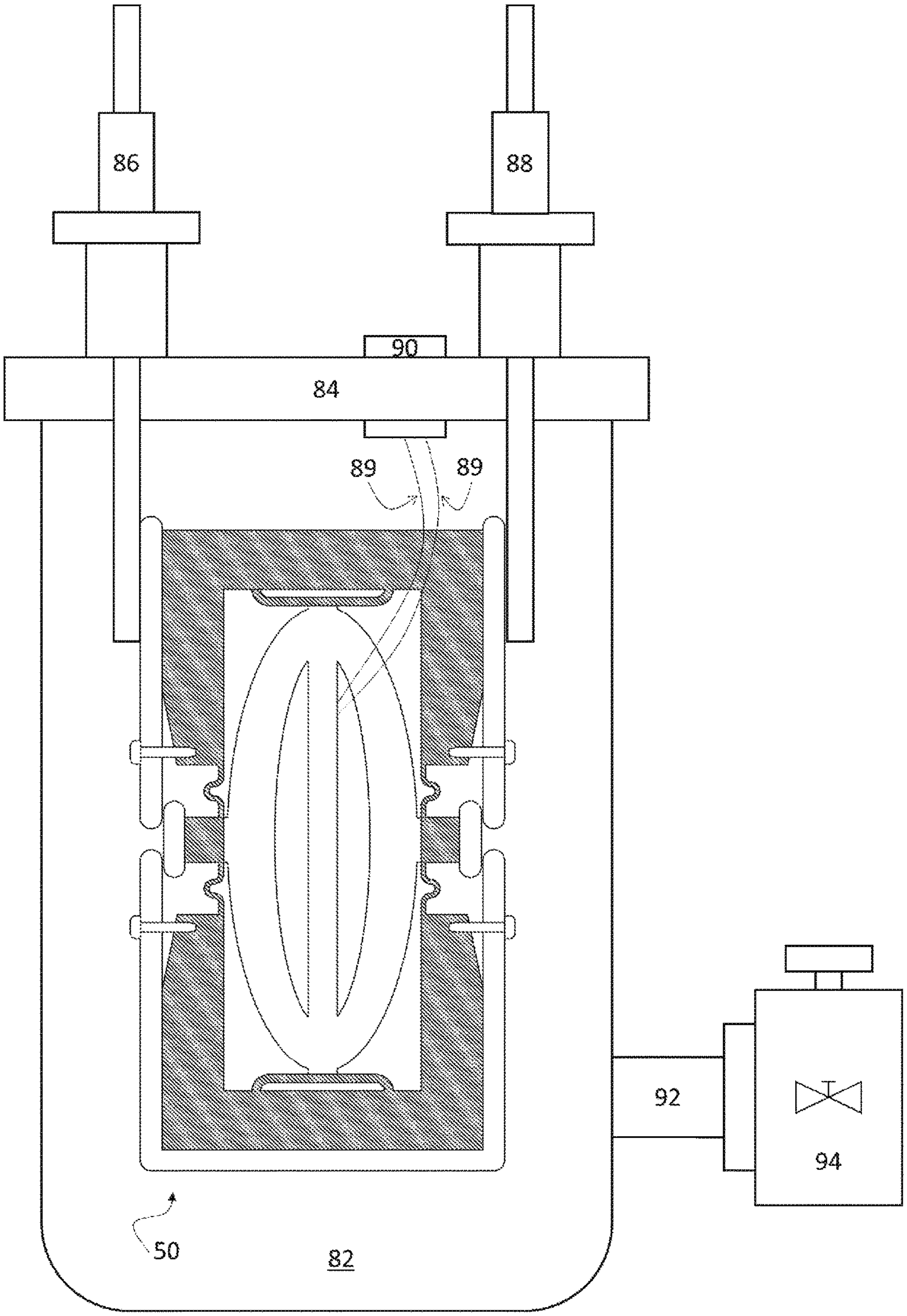
FIG. 3 depicts the embodiment of FIG. 2 implemented within a switching chamber.
Figure 4:
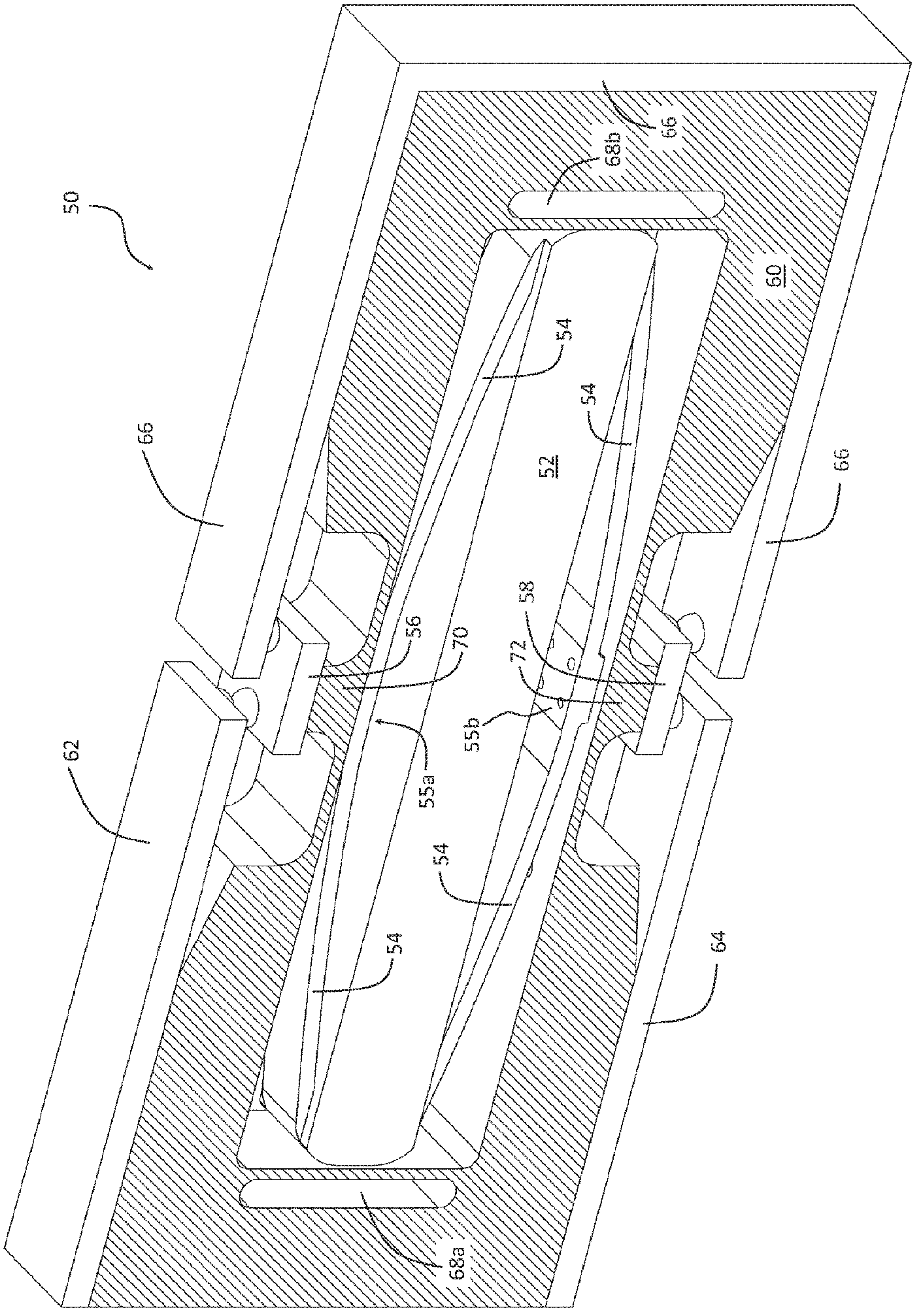
FIG. 4 is an isometric view of the embodiment of FIGS. 2-3.

FIGS. 2-4 depict an alternate embodiment of the current invention, generally denoted by the reference numeral 50.

Switching mechanism 50 can be based on the use of piezoelectric actuator (52) with elliptical shell (54) outside of piezoelectric actuator (52). The planar geometry allows for series and parallel connections to increase voltage withstand and current ratings with only minimum increase in size.

Elliptical shell actuator (54) can be used to drive (i.e., open and close) movable contacts (56, 58) of switching mechanism (50) on each side of elliptical shell (54) in a very fast manner, while still providing enough contact pressure for low ohmic contact resistance in closed state. At the same time, elliptical shell actuator (54) also allows for high voltage withstand capability in open state.

Movable contacts (56, 58) can be characterized as follows:

No electric arcs→little contact wear expected

Vacuum is benign environment→no oxidation, i.e., use of reactive materials (such as aluminum) possible Contact surface area vs. pressure/force, as described in H. Böhme, (2005). Mittel spannungstechnik Generally, switching mechanism (50) (e.g., disconnect switch) is based on a sheet (e.g., rectangular) of insulating material (60), optionally not much longer nor wider than the actuator itself in order to conserve material and make the implementation as compact as possible. The sheet of insulating material (60) can have its center area removed to accommodate actuator (52). The conductor runs on three sides along the edge of insulating material (60) where non-movable contacts (62, 64, 66) can be seen. Non-movable contact (66) can be positioned on three sides of insulating material (60), as seen in FIG. 2, and as such still be disposed between non-movable contact (62) and non-movable contact (64).

The long sides of actuator ellipse (54) can be held flexibly in place by slots (68*a*, 68*b*) in the insulator sheet (60). The short sides of actuator ellipse (54) can be deemed mounting plates (55*a*, 55*b*) in that mounting plates (55*a*, 55*b*) of actuator (52) cause movement of movable contacts (56, 58) in response to actuation of actuator ellipse (54) (i.e., mounting plates (55*a*, 55*b*) pull movable contacts (56, 58) inwards and away from non-movable contacts (62, 64, 66)). Mounting plates (55*a*, 55*b*) can be attached to stems (70, 72) cut into the insulating sheet (60). FIGS. 2-3 show actuator (52) in a fully extended position (i.e., actuator (52) is not powered/activated), such that movable contact (56) is physically pressed up against non-movable contacts (62, 66) and movable contact (58) is physically pressed up against non-movable contacts (64, 66). This can be compared to FIG. 1, where gaps (29*a*, 29*b*) exist, showing that actuators (24, 26 in FIG. 1) have been powered/activated. The operation is substantially similar, where actuator (52) has a contracted position when powered and an extended position when not powered. Accordingly, similar gaps (similar to variable gaps (29*a*, 29*b*) in FIG. 1) would exist between movable contacts (56, 58) and non-movable contacts (62, 64, 66). When these variable gaps exist as in FIG. 1, the electrical series is disconnected or broken. Alternatively, when movable contacts are physically pressed up against non-movable contacts (62, 64, 66) as in FIGS. 2-3, the electrical series is intact.

Four (4) optional precision adjustment screws (74, 76, 78, 80) can be coupled to non-movable contacts (62, 64, 66) and insulation material (60) to allow for adjustment of the contact pressure.

With this configuration, all four (4) contact points (i.e., movable contact (56) and non-movable contact (62), movable contact (56) and non-movable contact (66), movable contact (58) and non-movable contact (64), and movable contact (58) and non-movable contact (66)) are electrically in series and operate at the same time, thus providing four (4) times the standoff voltage while in open position.

As can be seen in FIG. 3, similar to the example of FIG. 1, switching mechanism (50) can be located in vessel (82) with flange (84) that features two power feedthroughs (86, 88) and one control wire signal feedthrough (90). Piezoelectric actuator (52, 54) can be controlled with control signal wires (89) that pass through the control wire feed-through (90).

Vessel (82) can be evacuated or pressurized through side port (92) with isolation valve (94). If vessel (82) contains a vacuum environment, the vacuum can be characterized as follows:

Breakdown by Field Emission

Theoretical limit: work function approx. 4.5 eV (equiv. 1000 kV/mm)

Practical limit: 1-30 kV/mm (depending on surface quality, material, and temperature)

GLOSSARY OF CLAIM TERMS

Actuator: This term is used herein to refer to a mechanism that causes two or more electrical contacts to contact each other or separate from each other by changing the position or one of the electrical contacts.

Electrical feedthrough: This term is used herein to refer to a conductor that carries a signal and/or power through an enclosure or chamber.

Electrical transfer or disconnect switch: This term is used herein to refer to an electrical component used to break an electrical circuit by interrupting the current and/or diverting the current from one conductor to another. For example, a transfer switch is an electrical switch that transfers a load between two sources. A disconnect switch is an electrical switch that completely halts the current in the circuit and/or diverts it to another source.

Insulating medium: This term is used herein to refer to a material or substance that does not permit the transfer of electricity therethrough.

Mounting plate: This term is used herein to refer to a component of an actuator (e.g., piezoelectric actuator) that, when prompted, exerts a force on the movable contacts to create a gap between the movable contacts and non-movable contacts, thus disconnecting the electrical series between the non-movable contacts, and ultimately cause the movable contacts to no longer physically contact the non-movable contacts.

Movable contact: This term is used herein to refer to a component of an electrical circuit, where the component has a variable position, and when it contacts another electrical contact, electrical current can be passed therebetween.

Non-movable electrical contact: This term is used herein to refer to a component of an electrical circuit, where the component is fixed in place and when contacted by another electrical contact, electrical current can be passed therebetween.

Piezoelectric actuator: This term is used herein to refer to a mechanism that causes two or more electrical contacts to contact each other or separate from each other in response to the generation of elimination of a voltage caused by an applied mechanical stress.

Precision adjustment screw: This term is used herein to refer to a device that is capable of altering the amount of spacing between two or more electrical components and/or regulating the pressure that two or more components exert on each other when contacting each other.

Static gap: This term is used herein to refer to a fixed spacing between two electrical components.

Switching chamber: This term is used herein to refer to any enclosure with a controlled environment that houses a switching mechanism and components thereof.

Variable gap: This term is used herein to refer to changeable spacing between two or more electrical components.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall therebetween.

What is claimed is:

1. An electrical transfer or disconnect switch, comprising:

a first electrical feedthrough disposed through an insulating medium, said first electrical feedthrough connected to a first non-movable electrical contact;

a second electrical feedthrough disposed through an insulating medium, said second electrical feedthrough connected to a second non-movable electrical contact;

a third non-movable electrical contact coupled to said insulating medium and positioned between said first non-movable electrical contact and said second non-movable electrical contact, such that a first static gap is disposed between said first non-movable contact and said third non-movable contact and such that a second static gap is disposed between said second non-movable contact and said third non-movable contact;

a first actuator aligned with said first static gap but positioned at a spaced distance away from said first non-movable contact, said third non-movable contact, and said first static gap;

a second actuator aligned with said second static gap but positioned at a spaced distance away from said second non-movable contact, said third non-movable contact, and said second static gap;

a first movable contact directly or indirectly coupled to said first actuator and aligned with said first static gap, such that a first variable gap is formed between said first movable contact and said first and third non-movable contacts, wherein when said first actuator is prompted, said first movable contact reduces said first variable gap until said first movable contact is contacting said first and third non-movable contacts simultaneously to complete a first series from said first non-movable contact to said third non-movable contact, said first actuator also generating contact pressure between said first movable contact and said first and third non-movable contacts; and a second movable contact directly or indirectly coupled to said second actuator and aligned with said second static gap, such that a second variable gap is formed between said second movable contact and said second and third non-movable contacts, wherein when said second actuator is prompted, said second movable contact reduces said second variable gap until said second movable contact is contacting said second and third non-movable contacts simultaneously to complete a second series from said third non-movable contact to said second non-movable contact, said second actuator also generating contact pressure between said second movable contact and said second and third non-movable contacts, wherein when said first movable contact is contacting said first and third non-movable contacts and when said second movable contact is contacting said first and second non-movable contacts, an electrical circuit is closed within said electrical transfer or disconnect switch, such that a current flows along a path of travel within said electrical transfer or disconnect switch across said first non-movable contact, said first movable contact, said third non-movable contact, said second movable contact, and said second non-movable contact.

2. An electrical transfer or disconnect switch as in claim 1, further comprising:

a switching chamber that encloses at least said insulating medium, said first non-movable contact, said second non-movable contact, said third non-movable contact, said first movable contact, and said second movable contact, wherein said switching chamber includes a flange coupled to a vessel.

3. An electrical transfer or disconnect switch as in claim 2, further comprising:

said first and second electrical feedthroughs being disposed through said flange into an interior of said switching chamber where said first and second electrical feedthroughs contact said first and second non-movable contacts, respectively, said first and second electrical feedthroughs each containing conductors that connect systems that are separated by a disconnect controlled by said switch.

4. An electrical transfer or disconnect switch as in claim 2, further comprising:

said switching chamber containing vacuum or pressurized gas.

5. An electrical transfer or disconnect switch as in claim 1, further comprising:

one or more precision adjustment screws coupled to said first, second, and third non-movable contacts for adjusting said first, second, and third non-movable contacts.

6. An electrical transfer or disconnect switch as in claim 1, further comprising:

one or more control signal wires that pass through a control wire feedthrough and are coupled to said first and second actuators for controlling said first and second actuators.

7. An electrical transfer or disconnect switch as in claim 1, further comprising:

said switch applied to a high current, low voltage system.

8. An electrical transfer or disconnect switch as in claim 1, further comprising:

said first and second actuators being piezoelectric actuators.

9. An electrical transfer or disconnect switch as in claim 1, further comprising:

a first insulator positioned between said first actuator and said first movable contact to electrically insulate said first actuator and said first movable contact from each other; and a second insulator positioned between said second actuator and said second movable contact to electrically insulate said second actuator and said second movable contact from each other.

10. An electrical transfer or disconnect switch, comprising:

a first non-movable electrical contact coupled to an insulating medium;

a second non-movable electrical contact coupled to said insulating medium;

a third non-movable electrical contact coupled to said insulating medium and positioned between said first non-movable electrical contact and said second non-movable electrical contact to provide conduction between said first non-movable electrical contact and said second non-movable electrical contact when electrically in series;

a first static gap disposed between said first non-movable contact and said third non-movable contact;

a second static gap disposed between said second non-movable contact and said third non-movable contact;

an actuator having a first mounting plate and a second mounting plate, said first mounting plate aligned with said first static gap but positioned at a spaced distance away from said first non-movable contact, said third non-movable contact, and said first static gap, said second mounting plate aligned with said second static gap but positioned at a spaced distance away from said second non-movable contact, said third non-movable contact, and said second static gap;

a first movable contact directly or indirectly coupled to said first mounting plate of said actuator and aligned with said first static gap, said first movable contact contacting said first and third non-movable contacts simultaneously to complete a first series between said first and third non-movable contacts, wherein when said actuator is prompted, said first mounting plate shifts away from said first and third non-movable contacts, such that a first variable gap is formed between said first movable contact and said first and third non-movable contacts, thus breaking or disconnecting said first series between said first and third non-movable contacts, said actuator also releasing contact pressure between said first movable contact and said first and third non-movable contacts; and a second movable contact directly or indirectly coupled to said second mounting plate of said actuator and aligned with said second static gap, said second movable contact contacting said second and third non-movable contacts simultaneously to complete a second series between said second and third non-movable contacts, wherein when said actuator is prompted, said second mounting plate shifts away from said second and third non-movable contacts, such that a second variable gap is formed between said second movable contact and said second and third non-movable contacts, thus breaking or disconnecting said second series between said second and third non-movable contacts, said actuator also releasing contact pressure between said second movable contact and said second and third non-movable contacts, wherein when said actuator is idle or unprompted, said first movable contact is contacting said first and third non-movable contacts and when said second movable contact is contacting said first and second non-movable contacts, an electrical circuit is closed within said electrical transfer or disconnect switch, such that a current flows along a path of travel within said electrical transfer or disconnect switch across said first non-movable contact, said first movable contact, said third non-movable contact, said second movable contact, and said second non-movable contact.

11. An electrical transfer or disconnect switch as in claim 10, comprising:

said actuator being a piezoelectric actuator.

12. An electrical transfer or disconnect switch as in claim 10, comprising:

said first static gap positioned on a substantially opposite side of said insulation medium from said second static gap, and said first and second mounting plates forming an elliptical shell configuration about said actuator, such that said first mounting plate faces a substantially opposite direction from said second mounting plate.

13. An electrical transfer or disconnect switch as in claim 12, wherein longitudinal ends of said actuator in said elliptical shell configuration are flexibly held within slots formed within said insulation medium.

14. An electrical transfer or disconnect switch as in claim 10, comprising:

one or more precision adjustment screws coupled to said first, second, and third non-movable contacts for adjusting said first, second, and third non-movable contacts.

15. An electrical transfer or disconnect switch as in claim 10, further comprising:

a switching chamber that encloses at least said insulating medium, said first non-movable contact, said second non-movable contact, said third non-movable contact, and said actuator, said switching chamber containing vacuum or pressurized gas.

16. An electrical transfer or disconnect switch as in claim 10, further comprising:

said switch applied to a low current, high voltage system.

17. An electrical transfer or disconnect switch as in claim 10, further comprising:

said insulation medium further disposed between said first mounting plate and said first movable contact to electrically insulate said first mounting plate and said first movable contact from each other; and said insulation medium further disposed between said second mounting plate and said second movable contact to electrically insulate said second mounting plate and said second movable contact from each other.

18. An electrical switch, comprising:

a first non-movable electrical contact coupled to an insulating medium;

a second non-movable electrical contact coupled to said insulating medium;

a static gap disposed between said first non-movable contact and said second non-movable contact;

an actuator aligned with said static gap but positioned at a spaced distance away from said first and second non-movable contacts, said actuator being a piezoelectric actuator or a magnetostrictive actuator, a movable contact directly or indirectly coupled to said actuator and aligned with said static gap, said movable contact contacting said first and second non-movable contacts simultaneously to complete a series between said first and second non-movable contacts, wherein when said actuator is prompted, said movable contact shifts away from said first and second non-movable contacts, such that a variable gap is formed between said movable contact and said first and second non-movable contacts, thus breaking or disconnecting said series between said first and second non-movable contacts, said actuator also releasing contact pressure between said movable contact and said first and second non-movable contacts, wherein when said actuator is idle or unprompted, said movable contact is contacting said first and second non-movable contacts, an electrical circuit is closed within said electrical switch, such that a current flows along a path of travel within said electrical switch across said first non-movable contact, said movable contact, and said second non-movable contact.

19. An electrical transfer or disconnect switch as in claim 18, further comprising:

a switching chamber that encloses at least said insulating medium, said first non-movable contact, said second non-movable contact, said movable contact, and said actuator, said switching chamber containing vacuum or pressurized gas.

20. An electrical transfer or disconnect switch as in claim 19, further comprising:

said insulation medium further disposed between said actuator and said movable contact to electrically insulate said actuator and said movable contact from each other.

* * * * *